(12) United States Patent
Yamamoto

(10) Patent No.: US 11,894,447 B2
(45) Date of Patent: Feb. 6, 2024

(54) METHOD FOR MANUFACTURING A SEMICONDUCTOR DEVICE WITH REDUCED VARIATION OF THE IMPURITY CONCENTRATION NEAR THE SURFACE OF THE SEMICONDUCTOR FILM

(71) Applicant: LAPIS SEMICONDUCTOR CO., LTD., Yokohama (JP)

(72) Inventor: Tetsuya Yamamoto, Yokohama (JP)

(73) Assignee: Lapis Semiconductor Co., Ltd., Yokohama (JP)

( * ) Notice: Subject to any disclaimer, the term of this patent is extended or adjusted under 35 U.S.C. 154(b) by 323 days.

(21) Appl. No.: 17/476,558

(22) Filed: Sep. 16, 2021

(65) Prior Publication Data

US 2022/0102536 A1 Mar. 31, 2022

(30) Foreign Application Priority Data

Sep. 29, 2020 (JP) ................................ 2020-163679

(51) Int. Cl.
*H01L 21/66* (2006.01)
*H01L 21/3213* (2006.01)
(Continued)

(52) U.S. Cl.
CPC ...... *H01L 29/66825* (2013.01); *H01L 21/266* (2013.01); *H01L 21/32139* (2013.01);
(Continued)

(58) Field of Classification Search
CPC ......... H01L 29/66825; H01L 21/31111; H01L 29/40114; H01L 29/42324; H01L 29/42328; H01L 21/02263; H01L 29/401; H01L 21/32139; H01L 29/788; H01L 29/42332; H01L 29/42344; H01L 21/266; H10B 41/30; H10B 41/35; H10B 69/00;
(Continued)

(56) References Cited

U.S. PATENT DOCUMENTS 10,700,174 B2 * 6/2020 Liu .................. G11C 16/14
10,868,152 B2 * 12/2020 Chiba ............... H01L 29/66825
(Continued)

FOREIGN PATENT DOCUMENTS

JP 2009-88143 A 4/2009

*Primary Examiner* — Maliheh Malek
(74) *Attorney, Agent, or Firm* — Volentine, Whitt & Francos, PLLC

(57) ABSTRACT

A method for manufacturing a semiconductor device includes: implanting a P-type impurity from a region where the first conductor film is formed toward an inside of the semiconductor substrate with a first acceleration energy; forming a nitride film provided with a first opening on the first conductor film; forming an insulating film with a second opening from which the first conductor film is exposed; forming a second conductor film to fill the second opening of the insulating film; removing the nitride film and a portion of the first conductor film positioned below the nitride film to expose the oxide film in a peripheral area of a formation region of the insulating film; and implanting the P-type impurity from a region from which the oxide film is exposed toward an inside of the semiconductor substrate with a second acceleration energy smaller than the first acceleration energy.

3 Claims, 9 Drawing Sheets

(51) Int. Cl.
    *H01L 29/66*     (2006.01)
    *H01L 29/423*     (2006.01)
    *H01L 29/788*     (2006.01)
    *H01L 21/266*     (2006.01)

(52) U.S. Cl.
    CPC ...... *H01L 29/42328* (2013.01); *H01L 29/788* (2013.01); *H01L 29/42324* (2013.01); *H01L 29/42332* (2013.01); *H01L 29/42344* (2013.01)

(58) Field of Classification Search
    CPC ........ H10B 41/10; H10B 41/00; H10B 41/43; H10B 41/49; H10B 43/27; H10B 43/30
    See application file for complete search history.

(56) References Cited

U.S. PATENT DOCUMENTS

| | | | | |
|---|---|---|---|---|
| 11,018,233 | B2* | 5/2021 | Chu | H01L 29/40114 |
| 11,081,557 | B2* | 8/2021 | Yu | H01L 29/40114 |
| 11,600,627 | B2* | 3/2023 | Yu | H01L 29/788 |
| 11,757,011 | B2* | 9/2023 | Cho | H01L 29/788 257/314 |
| 2002/0146886 | A1* | 10/2002 | Chern | H01L 29/42324 257/E21.209 |
| 2005/0167729 | A1* | 8/2005 | Jeon | H01L 29/42324 257/314 |
| 2005/0176201 | A1* | 8/2005 | Liu | H10B 43/30 438/257 |
| 2007/0200165 | A1* | 8/2007 | Jeong | H01L 29/7885 257/315 |
| 2007/0221987 | A1* | 9/2007 | Nagai | H10B 69/00 257/E29.302 |
| 2009/0085092 | A1* | 4/2009 | Nagai | H01L 29/42328 257/E47.001 |
| 2009/0096015 | A1* | 4/2009 | Io | H01L 29/7881 438/257 |
| 2011/0049605 | A1* | 3/2011 | Ishiguro | H10B 41/30 257/E21.209 |
| 2014/0094011 | A1* | 4/2014 | Do | H01L 29/0847 438/257 |
| 2015/0048439 | A1* | 2/2015 | Shum | H01L 29/66833 257/326 |
| 2017/0040334 | A1* | 2/2017 | Cheng | H10B 41/35 |
| 2017/0062448 | A1* | 3/2017 | Kitajima | H01L 29/42328 |
| 2019/0115454 | A1* | 4/2019 | Chiba | H01L 29/42328 |
| 2019/0355824 | A1* | 11/2019 | Liu | H01L 21/32139 |
| 2020/0152649 | A1* | 5/2020 | Chern | H10B 41/10 |
| 2021/0036117 | A1* | 2/2021 | Yu | H01L 29/785 |
| 2021/0066323 | A1* | 3/2021 | Huang | H10B 41/30 |
| 2021/0202706 | A1* | 7/2021 | Wang | H01L 21/32133 |
| 2021/0358927 | A1* | 11/2021 | Wang | G11C 16/0425 |
| 2022/0102536 | A1* | 3/2022 | Yamamoto | H01L 21/266 |
| 2022/0216315 | A1* | 7/2022 | Lin | H10B 41/30 |
| 2022/0285547 | A1* | 9/2022 | Yamamoto | H01L 29/66825 |
| 2022/0310845 | A1* | 9/2022 | Yu | H01L 29/42332 |

* cited by examiner

METHOD FOR MANUFACTURING A SEMICONDUCTOR DEVICE WITH REDUCED VARIATION OF THE IMPURITY CONCENTRATION NEAR THE SURFACE OF THE SEMICONDUCTOR FILM

CROSS-REFERENCE TO RELATED APPLICATION

This application is based upon and claims the benefit of priority from the prior Japanese Patent Application No. 2020-163679 filed on Sep. 29, 2020, the entire contents of which are incorporated herein by reference.

BACKGROUND

1. Technical Field

The present invention relates to a method for manufacturing a semiconductor device.

2. Description of the Related Art

As a non-volatile semiconductor memory device, there has been used a non-volatile memory including a floating gate. In a manufacturing process of such a non-volatile memory, an element isolation area is formed through a Shallow Trench Isolation (STI) process, thereby performing a patterning in a bit line direction of a floating gate.

As a method for manufacturing a non-volatile memory using the STI process, there has been proposed a method for manufacturing what is called a split gate type non-volatile memory (for example, JP-A-2009-88143). The method for manufacturing the non-volatile memory of JP-A-2009-88143 includes: a step of forming a first conductive material film for a floating gate on a first insulating film on a substrate and subsequently forming an element isolation insulating film extending in a first direction on the substrate; a step of forming a nitride film with an opening extending in a second direction perpendicular to the first direction on the first conductive material film and the element isolation insulating film and subsequently forming side wall-shaped spacer insulating films on respective side surfaces of the opening; a step of forming a second conductive material film between the spacer insulating films and subsequently forming a second insulating film on the second conductive material film; a step of removing the nitride film to expose an upper surface of the element isolation insulating film and etching the upper surface of the element isolation insulating film so as to become lower than an upper surface of the first conductive material film; and a step of selectively removing the first conductive material film using the second insulating film and the spacer insulating film as a mask to form a floating gate. Accordingly, a non-volatile memory having a structure in which a first split gate type non-volatile memory cell and a second split gate type non-volatile memory cell are configured surface-symmetrically between a first element isolation insulating film and a second element isolation insulating film is manufactured.

SUMMARY

In the above-described conventional method for manufacturing the semiconductor memory, after forming a polysilicon film constituting the floating gate (hereinafter referred to as an FG polysilicon film), a P-type impurity (for example, boron) for forming a P-type well is implanted into the semiconductor substrate. The implanting step of the P-type impurity includes a first implantation step of implanting the P-type impurity with a relatively small energy and a subsequent second implantation step of implanting the P-type impurity with a relatively large energy. The impurity is implanted to a position relatively close to the substrate surface (that is, a shallow position) by the first implantation step, and the impurity is implanted to a position relatively far from the substrate surface (that is, a deep position) by the second implantation step. The implantation of the P-type impurity in the first implantation step and the second implantation step is performed through the FG polysilicon film formed on the surface of the semiconductor substrate.

However, the FG polysilicon film has a film thickness that widely varies in a direction parallel to the surface of the semiconductor substrate (hereinafter referred to as a surface direction). Therefore, there has been a problem in that a channel concentration of the impurity in the surface direction of the semiconductor substrate widely varies especially near the surface of the semiconductor substrate to which the impurity is implanted in the first implantation step.

The present invention has been made in consideration of the above-described problem, and has an object to provide a method for manufacturing a semiconductor device that allows reducing a variation of an impurity concentration near a surface of a semiconductor substrate.

A method for manufacturing a semiconductor device according to the present invention includes forming an oxide film on one surface of a semiconductor substrate; forming a first conductor film on the oxide film; implanting a P-type impurity from a region where the first conductor film is formed on the one surface of the semiconductor substrate toward an inside of the semiconductor substrate with a first acceleration energy; forming a nitride film provided with a first opening on the first conductor film; forming an insulating film that covers a side surface of the first opening of the nitride film and is provided with a second opening from which the first conductor film is exposed; forming a second conductor film to fill the second opening of the insulating film; removing the nitride film and a portion of the first conductor film positioned below the nitride film to expose the oxide film in a peripheral area of a formation region of the insulating film on the one surface of the semiconductor substrate; and implanting the P-type impurity from a region from which the oxide film is exposed of the one surface of the semiconductor substrate toward an inside of the semiconductor substrate with a second acceleration energy smaller than the first acceleration energy.

According to the method for manufacturing the semiconductor device of the present invention, the variation of the impurity concentration near the surface of the semiconductor substrate can be reduced.

BRIEF DESCRIPTION OF THE DRAWINGS

Features of the present invention will be described below with reference to the accompanying drawings.

DETAILED DESCRIPTION

Figure 1:
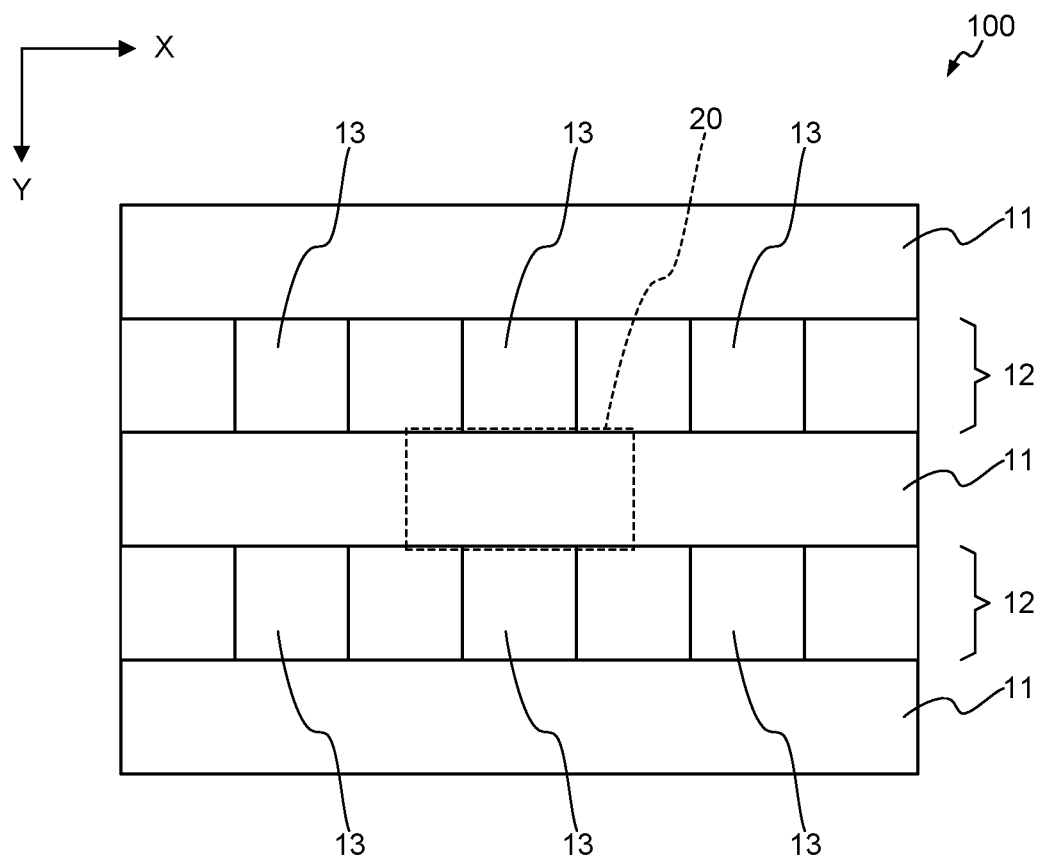
FIG. 1 is a top view illustrating a configuration of a semiconductor device according to the present invention.

Preferred embodiments of the present invention will be described in detail below. Note that the same reference numerals are given to substantially the same or equivalent parts in the description in the following embodiments and the accompanying drawings.

FIG. 1 is a top view of a part of a semiconductor device 100 according to an embodiment viewed from above an element formation surface. The semiconductor device 100 is a non-volatile memory including a plurality of memory cells. The semiconductor device 100 includes a plurality of active regions 11 extending in a bit line direction (X-direction of FIG. 1) and element isolation areas 12 with Shallow Trench Isolation (STI) separating the active regions 11. The element isolation area 12 includes gate select transistors (hereinafter referred to as GSTs 13) arranged in a direction perpendicular to the bit line direction (Y-direction of FIG. 1). A region indicated by a dashed line frame in FIG. 1 is a region corresponding to a memory cell 20 as one of the memory cells constituting the semiconductor device 100.

Figure 2:
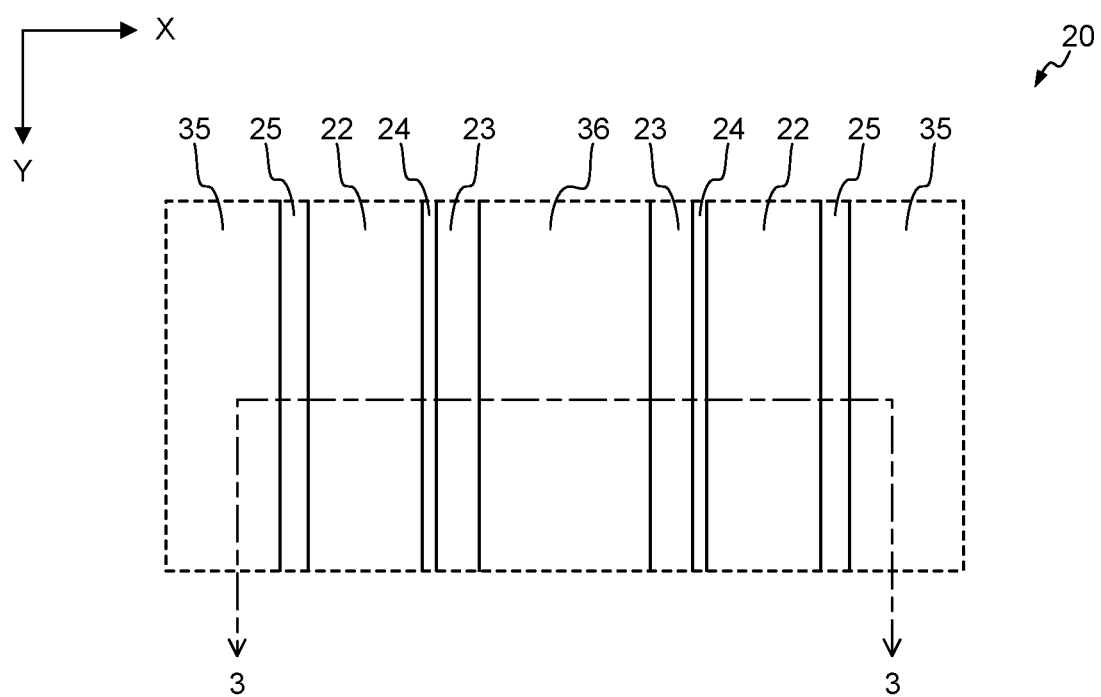
FIG. 2 is a top view illustrating an enlarged part of FIG. 1.

FIG. 2 is a top view of the memory cell 20 viewed from above the element formation surface. The memory cell 20 has a rectangular shape in top view.

The memory cell 20 includes source regions extending in the Y-direction of the drawing as a longitudinal direction. The source region includes a source plug (not illustrated in FIG. 2) and a source insulating film 36 formed on its upper surface. The memory cell 20 extends in the Y-direction of the drawing as a longitudinal direction similarly to the source region, and includes a pair of control gates 22 formed to sandwich the source region.

Between the source region including the source insulating film 36 and the control gate 22, a spacer insulating film 23 and a tunnel insulating film 24 are disposed. A side wall 25 is disposed outside the control gate 22 (that is, opposite side of source region). A coupling oxide film 35 is exposed outside the side wall 25.

Figure 3:
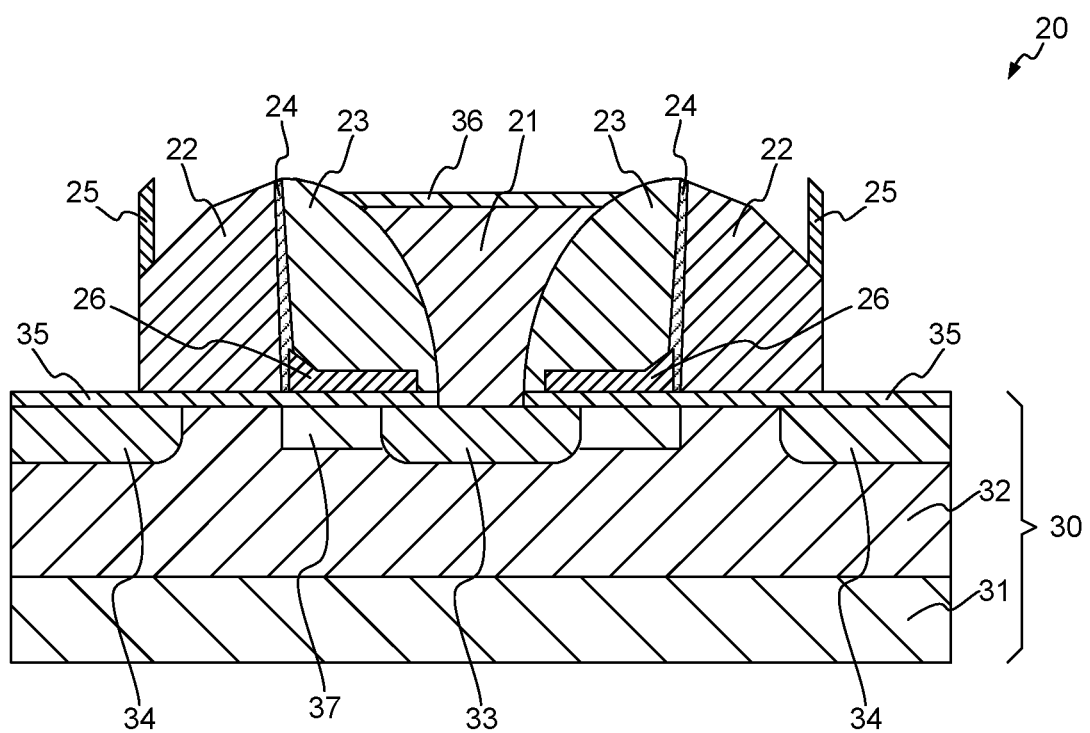
FIG. 3 is a cross-sectional view taken along a line 3-3 of the semiconductor device of FIG. 2.

FIG. 3 is a cross-sectional view taken along the line 3-3 of FIG. 2. The memory cell 20 is formed on a semiconductor substrate 30 that includes a non-dope region 31 and a well region 32.

The well region 32 is a first conductivity type well region formed by implanting a first conductivity type (P-type in this embodiment) impurity (for example, boron) into a silicon substrate. The well region 32 is formed to extend inward from one surface (hereinafter simply referred to as a surface) of the semiconductor substrate 30 serving as an element formation surface of the memory cell 20. The well region 32 includes a first diffusion layer 33 and a second diffusion layer 34 of a second conductivity type (N-type in this embodiment) as an opposite conductivity type of the first conductivity type.

The memory cell 20 of this embodiment includes a non-dope region 37 including a silicon substrate into which any impurity is not implanted. The non-dope region 37 is formed in a region of a superficial layer of the semiconductor substrate 30 positioned near the first diffusion layer 33 by performing a manufacturing method described later.

The first diffusion layer 33 is a source/drain diffusion region that functions as a drain when data is written to the memory cell 20 and functions as a source when data is read from the memory cell 20. The first diffusion layer 33 is formed by diffusing a N-type impurity (for example, P+) in the well region 32.

The second diffusion layer 34 is a source/drain diffusion region that functions as a source when data is written to the memory cell 20 and functions as a drain when data is read from the memory cell 20. The second diffusion layer 34 is formed by diffusing the N-type impurity in the well region 32.

The coupling oxide film 35 is formed on the surface of the semiconductor substrate 30. The coupling oxide film 35 is a thermally-oxidized film that functions as a gate insulating film between a gate and a channel (substrate) of the memory cell 20.

In the upper side of the surface of the semiconductor substrate 30, a floating gate 26 is formed via the coupling oxide film 35. In the upper side of the floating gate 26, the spacer insulating film 23 is formed. The spacer insulating films 23 is provided with an opening, and the floating gate 26 is separately formed to be opposed across the opening.

In the upper side of the surface of the semiconductor substrate 30, a source plug 21 is formed to cover the opening of the spacer insulating film 23. On the upper surface of the source plug 21, the source insulating film 36 is formed. The control gate 22 is formed at a position adjacent to the spacer insulating film 23 in the upper side of the surface of the semiconductor substrate 30 via the coupling oxide film 35. The side wall 25 is formed on the end portion of the control gate 22.

In the memory cell 20 of the semiconductor device 100 of this embodiment, data is written by implanting hot electrons generated in the semiconductor substrate 30 into the floating gate 26. The data is erased by pulling out the electrons from the floating gate 26 to the control gate 22. The data is read by applying a voltage for reading to the control gate 22. In the upper side of the semiconductor substrate 30, a contact (not illustrated in FIG. 3) for applying the voltage when performing writing, reading, and erasure of the data to the memory cell 20 is disposed.

Figure 4:
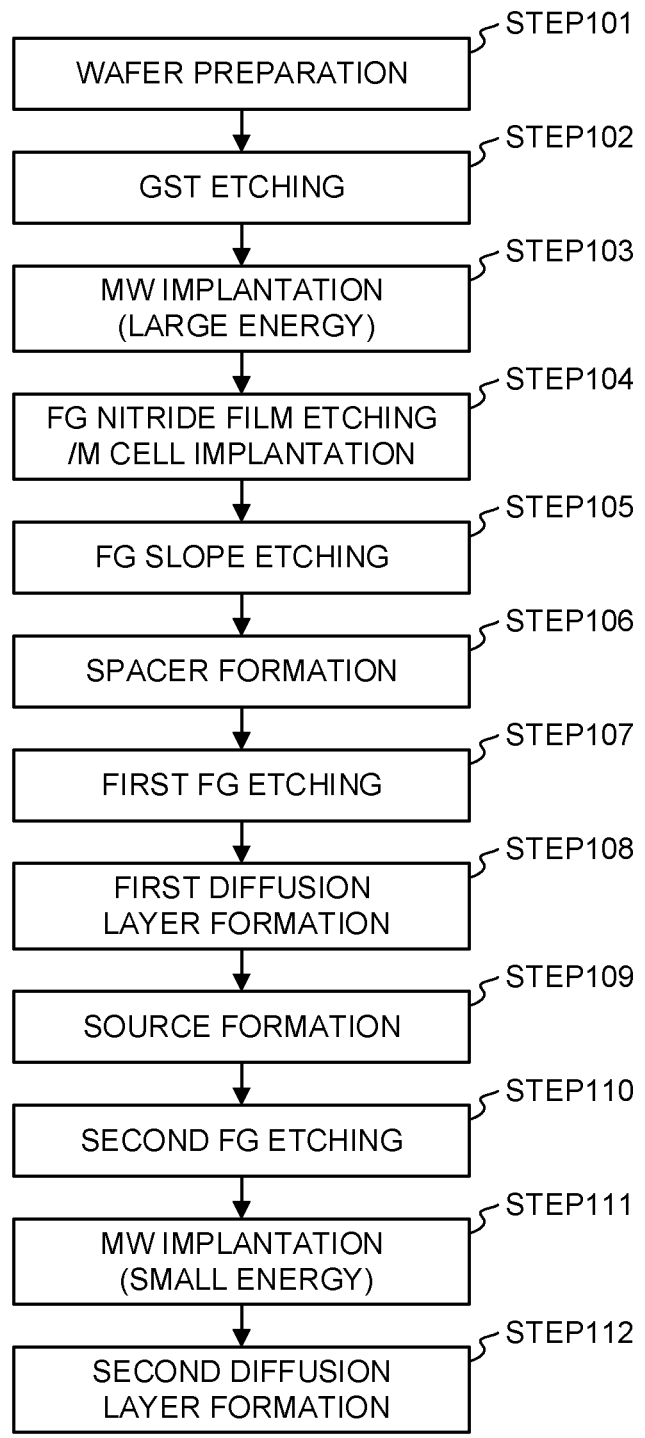
FIG. 4 is a flowchart illustrating a manufacturing procedure of a semiconductor device of an embodiment.

Next, a method for manufacturing the semiconductor device 100 of the embodiment will be described in accordance with a manufacturing process illustrated in FIG. 4.

First, the coupling oxide film 35 is formed on the surface of the semiconductor substrate 30 as a silicon substrate. Next, an FG polysilicon film 41 to serve as the floating gate 26 is formed on the coupling oxide film 35. Then, a field nitride film is formed on the polysilicon film for the floating gate. Next, a resist pattern is formed on the field nitride film and performs an etching, thus forming a trench for element isolation. This forms the semiconductor substrate 30 in which the coupling oxide film 35 and the FG polysilicon film 41 for the floating gate are sequentially laminated on the surface of the semiconductor substrate 30 and the trench for the element isolation is provided (STEP 101).

Next, the trench formed in STEP 101 is filled with an insulating film for the element isolation. Thus, the element isolation area 12 is formed. Then, photolithography and etching for forming a GST are performed on a part of the element isolation area 12. Thus, the GST 13 is formed (STEP 102).

Next, an impurity implantation (hereinafter referred to as MW implantation) for forming the well region 32 in the semiconductor substrate 30 is performed (STEP 103). In this embodiment, first, as a first MW implantation process, a P-type impurity (for example, boron) is implanted from the surface of the semiconductor substrate 30 with a relatively large first acceleration energy. Thus, the P-type impurity is implanted to a deep position viewed from the surface of the semiconductor substrate 30.

Figure 5A:
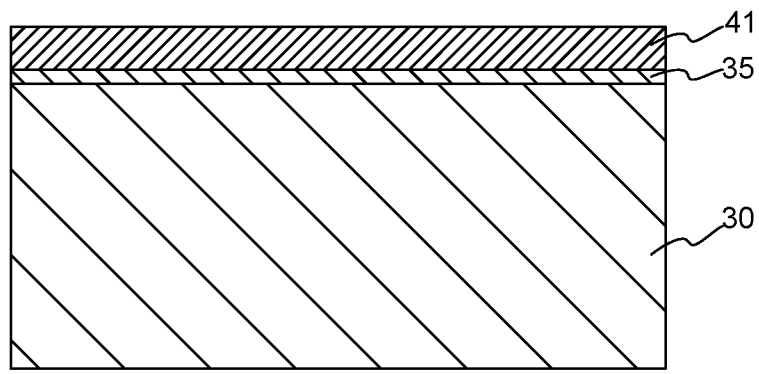
FIG. 5A is a cross-sectional view of the semiconductor device before performing a first MW implantation process.
Figure 5B:
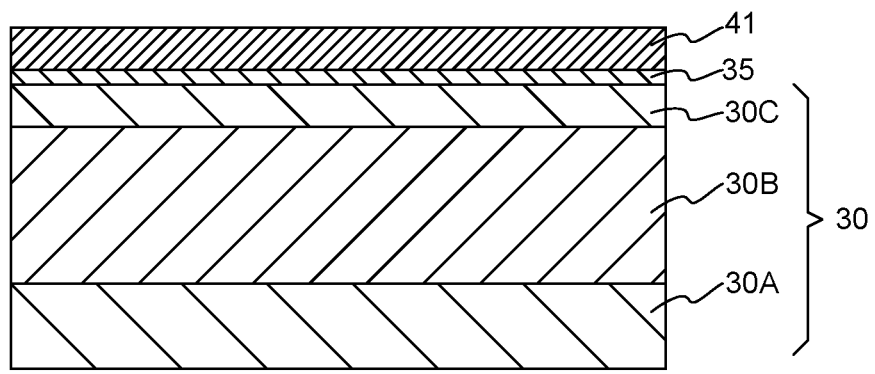
FIG. 5B is a cross-sectional view of the semiconductor device after performing the first MW implantation process.

FIG. 5A is a cross-sectional view illustrating the semiconductor substrate 30 before performing the process of STEP 103. FIG. 5B is a cross-sectional view illustrating the semiconductor substrate 30 after performing the process of STEP 103. By the MW implantation process of STEP 103, the P-type impurity is implanted to the deep position viewed from the surface of the semiconductor substrate 30. Accordingly, a non-doped substrate region 30A, a substrate region 30B (deep position) into which the impurity has been implanted, and a non-doped substrate region 30C (shallow position) are sequentially laminated. Note that the substrate region 30B into which the impurity has been implanted becomes a part of the well region 32 in FIG. 3 through the manufacturing process described below. A part of the non-doped substrate region 30C into which the impurity is not implanted becomes the non-dope region 37 in FIG. 3 through the manufacturing process described below.

Next, a nitride film 42 is formed on the surface of the FG polysilicon film 41 using a CVD method. Then, the nitride film 42 is removed by the patterning and the etching for forming the floating gate 26, and the impurity is implanted into the FG polysilicon film 41 using the nitride film 42 as a mask (STEP 104).

Figure 6A:
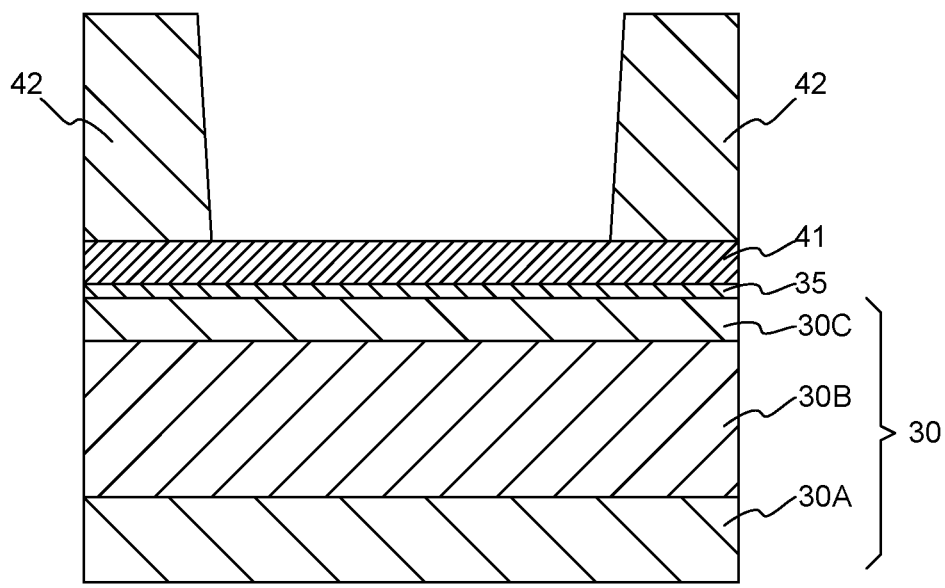
FIG. 6A is a cross-sectional view of the semiconductor device after performing a nitride film formation process.

FIG. 6A is a cross-sectional view illustrating the semiconductor substrate 30 in the state where the nitride film 42 has been formed. On the surface of the FG polysilicon film 41, the nitride film 42 with an opening (first opening) is formed. The impurity is implanted into the FG polysilicon film 41 exposed from the opening of the nitride film 42.

Figure 6B:
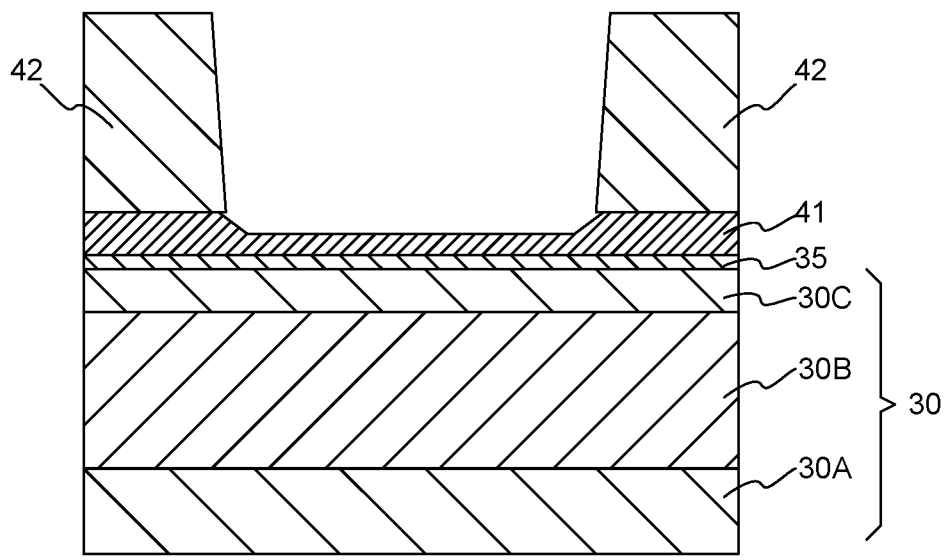
FIG. 6B is a cross-sectional view of the semiconductor device after performing an FG slope etching.

Next, the FG polysilicon film 41 is etched. Here, the etching is performed shallowly to the entire portion exposed from the opening of the nitride film 42 of the FG polysilicon film 41. Accordingly, as illustrated in FIG. 6B, a slope is formed on a boundary between the FG polysilicon film 41 and the nitride film 42 (STEP 105).

Next, the spacer insulating film 23 is formed so as to cover the sidewall portion of the opening of the nitride film 42 and be provided with an opening (second opening) to expose a part of the FG polysilicon film 41 (STEP 106).

Figure 7A:
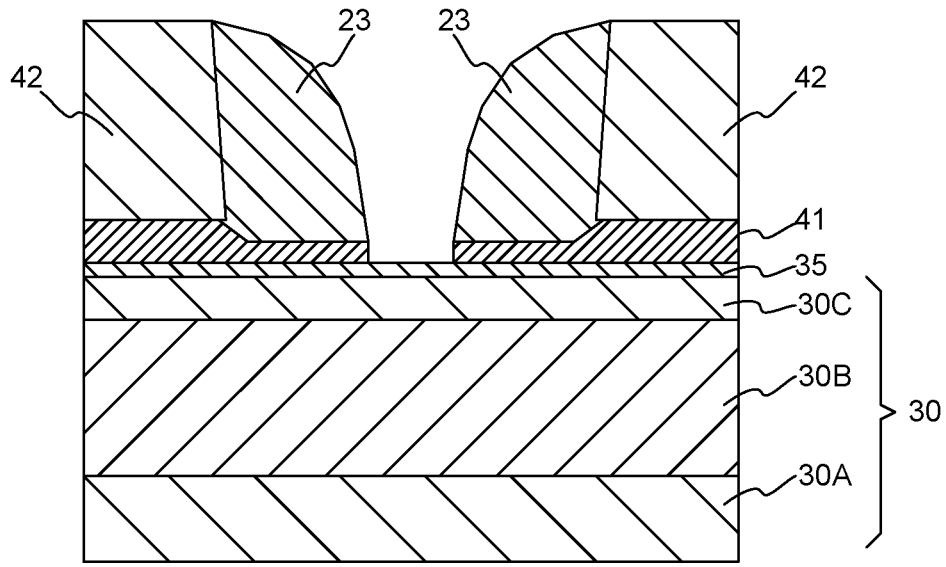
FIG. 7A is a cross-sectional view of the semiconductor device after performing a spacer formation process.

Next, as a first FG etching, the FG polysilicon film 41 positioned in the opening of the spacer insulating film 23 is etched, thereby removing the FG polysilicon film 41 in the opening (STEP 107). Accordingly, a structure, as illustrated in FIG. 7A, that includes the FG polysilicon film 41 having a shape of split gate and the spacer insulating film 23 disposed in its upper layer portion is formed.

Figure 7B:
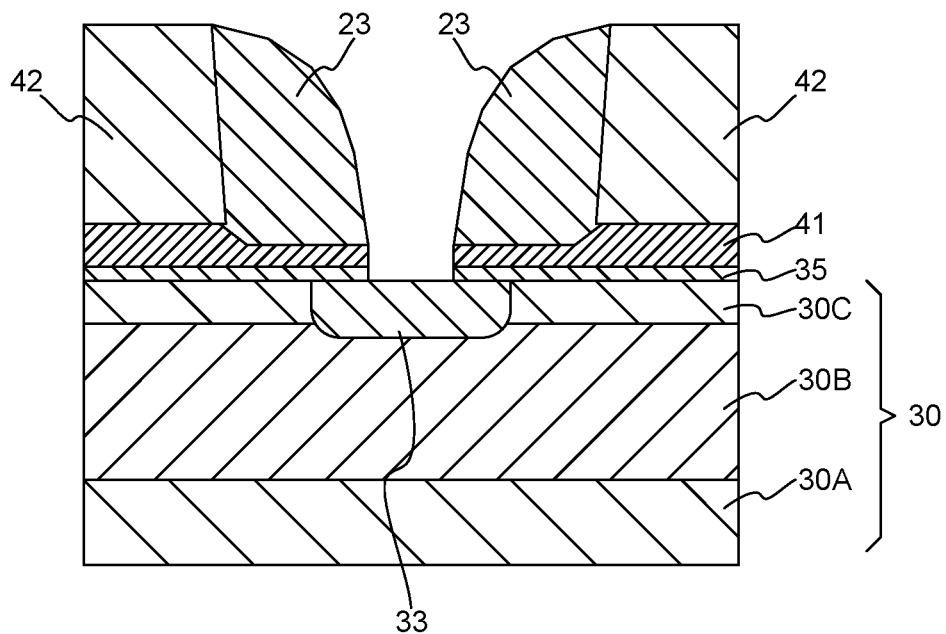
FIG. 7B is a cross-sectional view of the semiconductor device after performing a first diffusion layer formation process.

Next, the N-type impurity is implanted from the opening of the spacer insulating film 23 toward the inside of the semiconductor substrate 30. Thus, the first diffusion layer 33 is formed as illustrated in FIG. 7B (STEP 108).

Next, the source plug 21 is formed in the opening between the pair of spacer insulating films 23. The source insulating film 36 is formed on the upper surface of the source plug 21 (STEP 109).

Figure 8A:
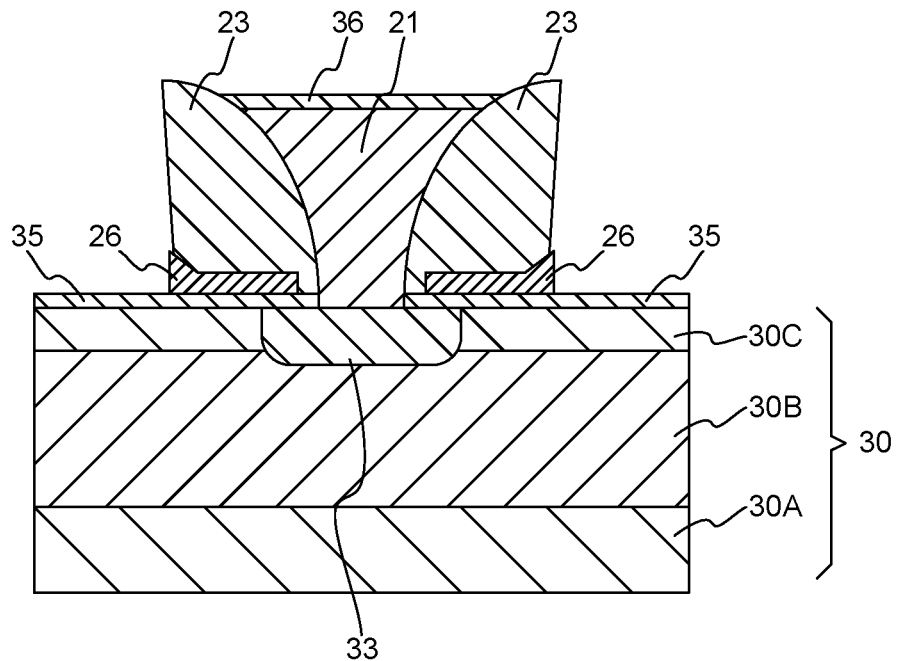
FIG. 8A is a cross-sectional view of the semiconductor device after performing a source formation process.

Next, the FG polysilicon film 41 is etched. Here, as a second FG etching, the FG polysilicon film 41 positioned outside the formation region of the spacer insulating film 23 is etched (STEP 110). Accordingly, as illustrated in FIG. 8A, the semiconductor substrate 30 in which the floating gate 26, the spacer insulating film 23, and the source plug 21 are disposed on the upper surface is formed.

Next, as a second MW implantation process for forming the well region 32 of the memory cell 20, the impurity is implanted (STEP 111). Here, the P-type impurity (boron) is implanted with a second acceleration energy that is low compared with the acceleration energy in the first MW implantation process of STEP 103. Accordingly, the P-type impurity is implanted to a position outside the spacer insulating film 23 and shallow (that is, near the superficial layer) viewed from the surface of the semiconductor substrate 30.

Figure 8B:
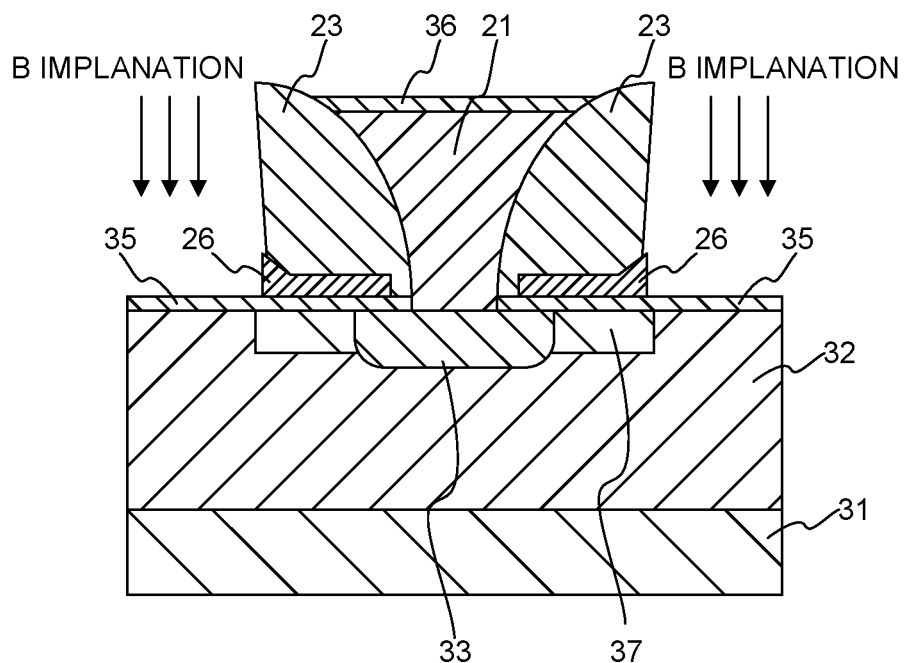
FIG. 8B is a cross-sectional view of the semiconductor device after performing a second MW implantation process.

FIG. 8B is a cross-sectional view illustrating the semiconductor substrate 30 after performing the MW implantation process of STEP 108. The P-type impurity is implanted to positions indicated by arrows in the drawing, that is, positions outside the formation regions of the spacer insulating films 23. Accordingly, the well region 32 is formed in the superficial layer portion of the semiconductor substrate 30 excluding immediately below the floating gate 26, the spacer insulating film 23, and the source plug 21.

After the above-described processes, formation of the second diffusion layer 34, formation of the contact gate, formation of the side wall 25, and the like are further performed, thus forming the memory cell 20 as illustrated in FIG. 3.

In the method for manufacturing the semiconductor device 100 of the embodiment, as the MW implantation that is the impurity implantation for forming the well region 32, the first MW implantation to implant the impurity to the deep position viewed from the surface of the semiconductor substrate 30, and the second MW implantation to implant the impurity to the shallow position viewed from the surface of the semiconductor substrate 30 are performed at different timings. Specifically, in the manufacturing method of the embodiment, after performing the first MW implantation in STEP 103, the floating gate 26, the spacer insulating film 23, and the source plug 21 are formed in STEPs 104 to 107, the FG polysilicon film 41 is removed excluding the formation position of the floating gate 26 by the etching in STEP 108, and subsequently, the second MW implantation is performed in STEP 109. With this manufacturing method, variation of impurity concentration inside the semiconductor substrate can be reduced compared with a case where the MW implantation to the position near the surface of the semiconductor substrate 30 is performed before the removal of the FG polysilicon film 41 (for example, a case where the MW implantation to the position near the surface of the semiconductor substrate 30 is performed continuously or integrally with the MW implantation to the deep position in STEP 103).

Figure 9:
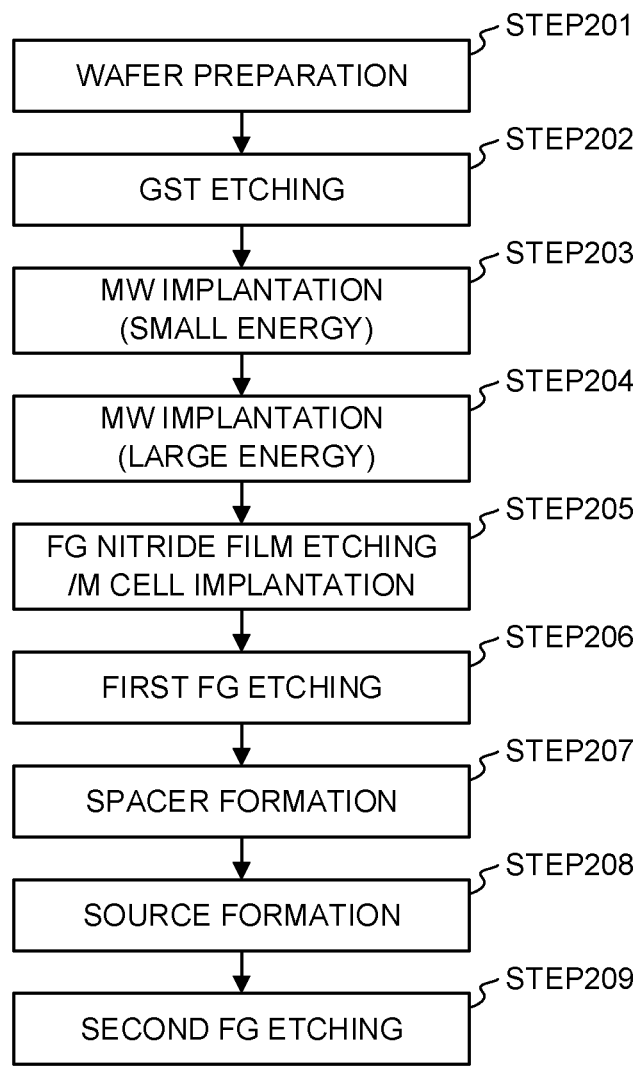
FIG. 9 is a flowchart illustrating a manufacturing procedure of a manufacturing method in a comparative example.

FIG. 9 is a flowchart illustrating a manufacturing method of a comparative example in which the MW implantation to the shallow position and the MW implantation to the deep position are continuously performed unlike the manufacturing method of the embodiment. In the manufacturing method of the comparative example, the impurity is implanted with the relatively low acceleration energy in STEP 203, and immediately thereafter, the impurity is implanted with the relatively high acceleration energy in STEP 204. In the manufacturing method of the comparative example, the impurity is implanted with the relatively low acceleration energy before the FG polysilicon film is etched in STEP 209. Therefore, the impurity is implanted to the shallow position of the semiconductor substrate passing through the FG polysilicon film. Since the FG polysilicon film has the film thickness with wide variation, the impurity concentration (that is, channel concentration) widely varies at the position close to the FG polysilicon film (that is, shallow position viewed from the surface of the semiconductor substrate) in the manufacturing method of the comparative example in which the impurity is implanted passing through the FG polysilicon film.

In contrast, in the manufacturing method of the embodiment, since the MW implantation is performed with the relatively low acceleration energy after the removal of the FG polysilicon film 41 by the etching in STEP 108, the impurity is implanted without passing through the FG polysilicon film 41. Accordingly, the variation of the impurity concentration caused by the variation of the film thickness of the FG polysilicon film does not occur.

As described above, with the method for manufacturing the semiconductor device of the embodiment, the variation of the impurity concentration near the surface of the semiconductor substrate can be reduced.

The present invention is not limited to the above-described embodiment. For example, while the case where the memory cell 20 has the rectangular shape in top view is described as an example in the above-described embodiment, the shape in top view is not limited thereto. The shapes of the source plug 21 and the control gate 22 are also not limited to those described in the embodiment.

The processes of STEP 104 to STEP 108 are not limited to those described in the embodiment. It is only necessary that the MW implantation (STEP 109) to implant the impurity to the proximity of the semiconductor substrate 30 surface is performed after the removal of the FG polysilicon film 41 in the region outside the spacer insulating film 23 (STEP 108).

What is claimed is:

1. A method for manufacturing a semiconductor device, comprising:
    forming an oxide film on one surface of a semiconductor substrate;
    forming a first conductor film on the oxide film;
    implanting a P-type impurity from a region where the first conductor film is formed on the one surface of the semiconductor substrate toward an inside of the semiconductor substrate with a first acceleration energy;
    forming a nitride film provided with a first opening on the first conductor film;
    forming an insulating film that covers a side surface of the first opening of the nitride film and is provided with a second opening from which the first conductor film is exposed;
    forming a second conductor film to fill the second opening of the insulating film;
    removing the nitride film and a portion of the first conductor film positioned below the nitride film to expose the oxide film in a peripheral area of a formation region of the insulating film on the one surface of the semiconductor substrate; and
    implanting the P-type impurity from a region from which the oxide film is exposed of the one surface of the semiconductor substrate toward an inside of the semiconductor substrate with a second acceleration energy smaller than the first acceleration energy.

2. The method for manufacturing the semiconductor device according to claim 1, further comprising:
    between the forming of the insulating film and the forming of the second conductor film,
        removing the first conductor film in the second opening; and
        implanting a N-type impurity from the second opening toward an inside of the semiconductor substrate.

3. The method for manufacturing the semiconductor device according to claim 1, wherein
    the first conductor film is a polysilicon film, and
    the semiconductor substrate is a silicon substrate.

* * * * *